(12) United States Patent
Mitsumori et al.

(10) Patent No.: US 8,837,108 B2
(45) Date of Patent: Sep. 16, 2014

(54) GLASS SUBSTRATE-HOLDING TOOL AND METHOD FOR PRODUCING AN EUV MASK BLANK BY EMPLOYING THE SAME

(75) Inventors: Takahiro Mitsumori, Chiyoda-ku (JP); Hirotoshi Ise, Chiyoda-ku (JP); Takeru Kinoshita, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 138 days.

(21) Appl. No.: 13/475,459

(22) Filed: May 18, 2012

(65) Prior Publication Data

US 2012/0321999 A1    Dec. 20, 2012

(30) Foreign Application Priority Data

Jun. 14, 2011 (JP) .................. 2011-132462

(51) Int. Cl.
*H01L 21/683* (2006.01)
*H01T 23/00* (2006.01)
*G03F 1/24* (2012.01)

(52) U.S. Cl.
CPC .............. *H01L 21/6831* (2013.01); *G03F 1/6831* (2013.01)
USPC ......................................................... 361/234

(58) Field of Classification Search
USPC ......................................................... 361/234
See application file for complete search history.

(56) References Cited

U.S. PATENT DOCUMENTS

| | | | |
|---|---|---|---|
| 5,179,498 A * | 1/1993 | Hongoh et al. ............... 361/234 |
| 6,087,205 A * | 7/2000 | Yamamori .................... 438/158 |
| 2005/0128462 A1 | 6/2005 | Matsui |
| 2005/0207089 A1 | 9/2005 | Ito |
| 2006/0024591 A1 | 2/2006 | Itoh |
| 2007/0217117 A1 * | 9/2007 | Ohta et al. .................... 361/234 |
| 2010/0096262 A1 | 4/2010 | Aruga et al. |

FOREIGN PATENT DOCUMENTS

| | | |
|---|---|---|
| JP | 2000-286191 | 10/2000 |
| JP | 2005-109332 | 4/2005 |
| JP | 2005-150527 | 6/2005 |
| JP | 2005-268524 | 9/2005 |
| JP | 2006-39223 | 2/2006 |
| JP | 2006-332519 | 12/2006 |
| JP | 2009-88558 | 4/2009 |
| JP | 2009-105238 | 5/2009 |

(Continued)

OTHER PUBLICATIONS

U.S. Appl. No. 13/347,150, filed Jan. 10, 2012, Takahiro Mitsumori, et al.

*Primary Examiner* — Dharti Patel
(74) *Attorney, Agent, or Firm* — Oblon, Spivak, McClelland, Maier & Neustadt, L.L.P.

(57) ABSTRACT

A glass substrate-holding tool, adapted to be employed during the production of a reflective mask blank for EUV lithography (EUVL), includes an electrostatic chuck and a supporting member. The chuck attracts a rear surface of a glass substrate in a non-contact manner by electrostatic attractive force. The supporting member partly supports the rear surface. An area ratio of a projected area of an active surface of the chuck for providing the electrostatic force to an area of a quality-guaranteed region of the rear surface is from 0.5 to 1.0. The active surface is apart from the rear surface by more than 20 μm. The supporting member is configured to support only a region including at least two of four sides defining an outer portion outside the quality-guaranteed region.

20 Claims, 4 Drawing Sheets

(56) References Cited

FOREIGN PATENT DOCUMENTS

| JP | 2009-177126 | 8/2009 |
| JP | 2009-266886 | 11/2009 |
| WO | WO 2009/035002 A1 | 3/2009 |

* cited by examiner

GLASS SUBSTRATE-HOLDING TOOL AND METHOD FOR PRODUCING AN EUV MASK BLANK BY EMPLOYING THE SAME

BACKGROUND OF INVENTION

1. Field of Invention

The present invention relates to a glass substrate-holding tool. The glass substrate-holding tool according to the present invention is useful for holding a glass substrate during the production of a reflective mask blank for EUV (Extreme Ultra Violet) lithography (hereinbelow, referred to as "EUV mask blank" in the specification) to be used for, e.g. the production of semiconductors, and during the production of a functional film-provided substrate for such an EUV mask blank.

Further, the present invention relates to a method for producing an EUV mask blank and a functional film-provided substrate for such an EUV mask blank by employing the glass substrate-holding tool according to the present invention.

2. Discussion of Background

In the semiconductor industry, a photolithography method using visible light or ultraviolet light has been employed as a technique for transferring a fine pattern on a silicon substrate or the like, which is required for forming an integrated circuit including such a fine pattern. However, the conventional photolithography method has reached near to the limit while semiconductor devices have had finer patterns at an accelerated pace. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF lasers, has been considered as being promising as the exposure technique for 45 nm or below. In this specification, it should be noted that the phrase "EUV light" means a ray having a wavelength in a soft X ray region or a vacuum ultraviolet ray region, specifically a ray having a wavelength of about 10 to 20 nm, in particular of about 13.5 nm±0.3 nm.

It is impossible to employ a conventional dioptric system like photolithography using visible light or ultraviolet light since EUV light is apt to be absorbed by any substances and since the refractive index of the substances is close to 1 at this wavelength. For this reason, a catoptric system, i.e., a combination of a reflective photomask and a mirror, is employed in EUV light lithography.

A mask blank is a stacked member to be used for fabrication of a photomask, which has not been patterned yet. In the case of an EUV mask blank, it has a structure wherein a substrate made of glass or the like has a reflective layer for reflecting EUV light and an absorber layer for absorbing EUV light, formed thereon in this order. As the reflective layer, a Mo/Si multilayer reflective film is usually employed wherein molybdenum (Mo) layers as low refractive layers and silicon (Si) layers as high refractive layers are alternately stacked to increase a light reflectance when irradiating a layer surface with EUV light.

As the absorber layer, a material having a high absorption coefficient to EUV light, specifically, e.g. a material containing chromium (Cr) or tantalum (Ta) as the main component, is employed.

The multilayer reflective film and the absorber layer are formed on an optical surface of a glass substrate by, e.g. an ion beam sputtering method or a magnetron sputtering method. At the time of forming the multilayer reflective film and the absorber layer, the glass substrate is held by a holding tool. Although a mechanical chuck and an electrostatic chuck are used as a glass substrate-holding tool, it is preferred in terms of a reduction in dust generation that such an electrostatic chuck be used as the glass substrate-holding tool to catch and hold the glass substrate at the time of forming the multilayer reflective film and the absorber layer, in particular at the time of forming the multilayer reflective film.

The electrostatic chuck is a technique which has been heretofore used to catch and hold a silicon wafer in a process for producing semiconductor devices. The electrostatic chuck catches and holds a silicon wafer by an electrostatic attractive force which is generated by bringing a central portion of the silicon wafer into contact with a catching and holding surface having a planar shape in a circular shape, a rectangular shape or the like, and applying a voltage across electrode portions embedded in a dielectric layer forming the catching and holding surface.

For catching and holding a glass substrate, the electrostatic chuck is also used such that the entire portion of the glass substrate, including a central portion thereof, specifically the entire portion of a rear surface of the glass substrate (the entire portion of a rear surface of the glass substrate including a central portion thereof) opposite to the film deposition surface of the glass substrate with a multilayer reflective film and an absorber layer expected to be stacked thereon during the production of an EUV mask blank, is brought into contact with the catching and holding surface of the electrostatic chuck to carry out the catching and holding operation, for, e.g. reasons that the shape of the electrode portions is not complicated, that it is possible to provide a sufficient holding force, and that the caught and held glass substrate is prevented from inclining (see Patent Documents 1 to 9).

It has been heretofore considered that it is preferred to bring the entire portion of the glass substrate including the central portion thereof in contact with the catching and holding surface of the electrostatic chuck to carry out the holding operation since it is possible to make device design simple and since it is possible to reduce costs by utilizing an electrostatic chuck widely used for catching and holding a silicon wafer.

Hereinbelow, the surface of a glass substrate with a multilayer reflective film or an absorber layer expected to be stacked thereon during the production of an EUV mask blank is referred to as the "film deposition surface" of the glass substrate, and the rear surface of the glass substrate opposite to the film deposition surface is referred to as the "rear surface" in the specification.

However, when a glass substrate is held by bringing a central portion of the rear surface of the glass substrate into contact with the catching and holding surface of an electrostatic chuck, it is likely that foreign substances deposit on the central portion of the rear surface of the glass substrate, or that the central portion of the rear surface of the glass substrate is scratched. In the case of a glass substrate used for production of EUV mask blank, the central portion of the rear surface of the glass substrate is a portion that is also usually designated as a quality-guaranteed region for every device, such as an exposure system, and is required to be free from the deposition of foreign substances or the occurrence of scratches. From this point of view, the deposition of foreign substrates or the occurrence of scratches on the central portion of the rear surface could cause a serious problem.

It appears to be sufficient to bring an outer edge portion of the rear surface of a glass substrate except for the quality-guaranteed region into contact with the catching and holding surface of an electrostatic chuck in order to prevent the deposition of foreign substances or the occurrence of scratches on a central portion of the rear surface.

Patent Document 10 listed below discloses an exposure system which employs a non-contact type electrostatic chuck and a contact type electrostatic chuck to hold a reflective mask, although having no purpose of preventing foreign substances from adhering to such a central portion or such a central portion from being scratched. In this exposure system, a reflective mask has a central portion of its rear surface placed in a non-contact state with the non-contact type electrostatic chuck by a gap and is held by the contact type electrostatic chuck at three points on a peripheral portion of the rear surface. It is regarded that the gap between the central portion of the rear surface of the reflective mask and the non-contact type electrostatic chuck is preferably at most 20 μm, more preferably at most 10 μm, further preferably at most 5 μm.

However, when the glass substrate is held by bringing the peripheral portion of the rear surface into contact with the catching and holding surface of the electrostatic chuck, the surface area of a portion of the glass substrate in contact with the catching and holding surface of the electrostatic chuck (hereinbelow also referred to as "the caught and held portion" of a glass substrate in the specification) is reduced. Accordingly, when an attempt is made to provide a catching and holding force enough to hold the glass substrate, the pressure per unit area applied to the caught and held portion is increased, which is likely to cause a problem of occurrence of scratches on the caught and held portion or of occurrence of foreign substances caused by such scratches. Further, a large amount of charged foreign substances are likely to be attracted by an electrostatic field generated at the caught and held portion.

Since the caught and held portion is present on the peripheral portion of the rear surface, the effect caused by the occurrence of scratches or foreign substances is minor than a case where a similar problem is caused on the quality-guaranteed region of the rear surface. However, it is likely that foreign substances formed at the caught and held portion or foreign substances attracted to the caught and held portion are partly transferred to the quality-guaranteed region of the rear surface. When the caught and held portion is scratched, it is likely that the force required for holding the glass substrate is reduced in a post-process for a mask blank produced on the glass substrate. Specifically, an electrostatic chuck is used as the glass substrate-holding tool to catch and hold a glass substrate in a mask patterning process for fabricating a reflective mask from an EUV mask blank, or in handling of a reflective mask for exposure in EUV lithography. If the caught and held portion is scratched to form a step, it is likely that the flatness of the caught and held portion is degraded to reduce the catching and holding force of the electrostatic chuck.

On the other hand, when an attempt is made to reduce the catching and holding force of an electrostatic chuck in order to prevent the caught and held portion from being scratched or a large amount of foreign substances from being attracted to the caught and held portion, the catching and holding force applied to a glass substrate become insufficient. During the production of an EUV mask blank, a multilayer reflective film or an absorber layer is normally deposited with a glass substrate being rotated, or with a glass substrate being longitudinally placed so as to have the film deposition surface vertically oriented according to the structure of a film deposition system in some cases. If the catching and holding force applied to the glass substrate become insufficient in such cases, the glass substrate is likely to be displaced or come off.

Patent Document 10 exemplifies a vacuum absorption device, an electromagnetic attraction device and a mechanical holding device in addition to an electrostatic attraction device (i.e. a contact type electrostatic chuck) as a device for holding a reflective mask at a peripheral portion of its rear surface. However, the use of an electromagnetic attraction device has a similar problem to a case where a contact type electrostatic chuck is used.

This is also applicable to the use of a vacuum absorption device or a mechanical holding device since the surface area of a portion of a glass substrate in contact with such a device is small. Under this circumstance, when an attempt is made to provide a holding force enough to hold the glass substrate, the pressure per unit area applied to the held portion of the glass substrate is increased, which is likely to cause a problem of occurrence of scratches on the caught and held portion or of occurrence of foreign substances caused by such scratches as in the use of an electrostatic attraction device. Such a vacuum absorption device cannot fulfill its function in a highly vacuum state where it is impossible to ensure a sufficient absorbing force, i.e. a state where the relationship of (force required for absorption)>(ultimate vacuum pressure)×(contact area) is established. In other words, it is practically impossible to hold a silicon wafer or a glass substrate by vacuum absorption in a vacuum state having at most 1 Pa, which is generally regarded as being a high vacuum state.

Further, Patent Document 10 recites that the gap between a central portion of the rear surface of a reflective mask and a non-contact electrostatic chuck is preferably at most 20 μm, more preferably at most 10 μm, further more preferably at most 5 μm. However, in a case where the gap between a central portion of the rear surface of a reflective mask and a non-contact electrostatic chuck is such a narrow gap, if foreign substances attracted by an electrostatic attractive force from the electrostatic chuck are caught in the gap, a glass substrate and the electrostatic chuck are both scratched, which fails to solve a problem of preventing scratches in spite of providing such a gap.

Furthermore, if foreign substances are caught in the gap between such a central portion of the rear surface of the glass substrate and the non-contact electrostatic chuck, the glass substrate is likely to be deformed. If the glass substrate is deformed, the glass substrate is likely to be further deformed by a film stress caused in a multilayer film or an absorber layer.

In the exposure system disclosed in Patent Document 10, a reflective mask is deformed since a central portion of the rear surface of the reflective mask and a non-contact electrostatic chuck are placed in a non-contact state so as to have a gap therebetween. The deformation of a glass substrate during the production of an EUV mask blank is not preferred as described above.

PRIOR ART DOCUMENTS

Patent Documents

Patent Document 1: JP-A-2000-286191
Patent Document 2: JP-A-2005-109332
Patent Document 3: JP-A-2005-268524
Patent Document 4: JP-A-2006-332519
Patent Document 5: WO-A-2009/035002
Patent Document 6: JP-A-2009-105238
Patent Document 7: JP-A-2009-177126
Patent Document 8: JP-A-2009-266886

Patent Document 9: JP-A-2009-88558
Patent Document 10: JP-A-2005-150527

SUMMARY OF INVENTION

In order to solve the above-mentioned problems of the prior art, it is an object of the present invention to provide a glass substrate-holding tool which is capable of preventing a glass substrate from being displaced, coming off or being deformed and controlling the occurrence of scratches or the deposition of foreign substances on the glass substrate caused by holding action during the production of an EUV mask blank, and a method for producing EUV mask blank and a functional film-provided substrate for EUV mask blank by employing the glass substrate-holding tool.

In order to attain the above-mentioned object, the present invention provides a glass substrate-holding tool, which is adapted to be employed during the production of a reflective mask blank for EUV lithography (EUVL), and which includes an electrostatic chuck for attracting a rear surface of a glass substrate in a non-contact state by an electrostatic attractive force, and a supporting member for partly supporting the rear surface of the glass substrate;

wherein the ratio of a projected area (mm$^2$) of an active surface of the electrostatic chuck to provide the electrostatic attractive force, to an area (mm$^2$) of a quality-guaranteed region of the rear surface of the glass substrate ((a projected area of an active surface of the electrostatic chuck)/(an area of a quality-guaranteed region of the rear surface of the glass substrate)) is at least 0.5 and at most 1.0;

the active surface of the electrostatic chuck is apart from the rear surface of the glass substrate by a distance of longer than 20 μm; and the supporting member is configured to support only a region including at least two sides among four sides defining an outer portion (outer peripheral portion of the rear surface) outside the quality-guaranteed region of the rear surface of the glass substrate.

In the glass substrate-holding tool according to the present invention, the active surface of the electrostatic chuck is preferably apart from the rear surface of the glass substrate by a distance of at least 30 μm and at most 100 μm.

In the glass substrate-holding tool according to the present invention, the supporting member is preferably made of a material having a lower hardness than the glass substrate.

In the glass substrate-holding tool according to the present invention, the supporting member preferably attracts a supported portion of the rear surface of the glass substrate by van der Waals attraction.

The glass substrate-holding tool according to the present invention preferably has a holding force of at least 1,960 N for the glass substrate.

Further, the present invention provides a method for producing a reflective layer-provided substrate for EUV lithography (EUVL) having a reflective layer for reflecting EUV light which is formed on one surface of a glass substrate, wherein the glass substrate-holding tool according to the present invention is employed to hold the glass substrate when the reflective layer is formed on the glass substrate by a dry deposition method.

Further, the present invention provides a method for producing a reflective mask blank for EUV lithography (EUVL) having a reflective layer for reflecting EUV light and an absorber layer for absorbing EUV light which are formed on one surface of a glass substrate at least in this order, wherein the glass substrate-holding tool according to the present invention is employed to hold the glass substrate when at least one of the reflective layer and the absorber layer is formed on the glass substrate by a dry deposition method.

In accordance with the present invention, it is possible to prevent a glass substrate from being displaced, coming off or being deformed and to control the occurrence of scratches or the deposition of foreign substances on the glass substrate caused by holding action during the production of a EUV mask blank.

DETAILED DESCRIPTION OF PREFERRED EMBODIMENTS

Now, the glass substrate-holding tool according to the present invention will be described in reference to the accompanying drawings.

Figure 1:
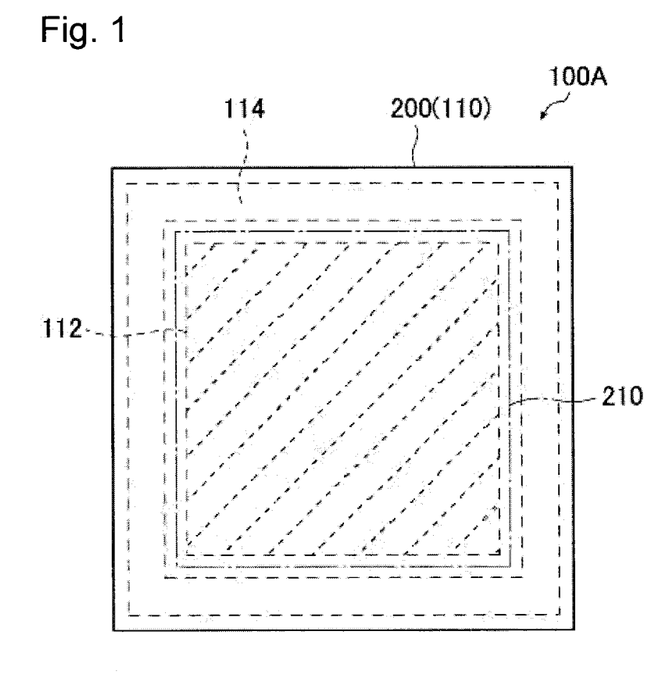
FIG. 1 is a schematic plan view of the glass substrate-holding tool according to an embodiment of the present invention wherein a glass substrate is shown to be carried in the substrate-holding tool.
Figure 2:
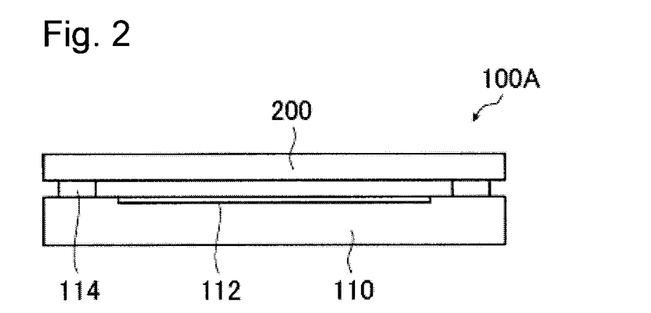
FIG. 2 is a side view of FIG. 1 wherein portions of a supporting member on a front side and a back side in this figure are not shown.

FIG. 1 is a schematic plan view showing the glass substrate-holding tool according to an embodiment of the present invention. FIG. 2 is a side view of the glass substrate-holding tool 100A shown in FIG. 1. In these figures, a glass substrate 200 is shown to be carried in the glass substrate-holding tool 100A in order to clarify how to hold the glass substrate by the glass substrate-holding tool according to the present invention. In FIG. 2, portions of a supporting member 114 on a front side and a back side in this figure are not shown in order to readily understand the structure of the glass substrate-holding tool 100A.

The glass substrate-holding tool according to the present invention includes an electrostatic chuck for attracting a rear surface of a glass substrate in a non-contact state by an electrostatic attractive force, and a supporting member for partly supporting the rear surface of the glass substrate, and holds the glass substrate by employing these members.

In the glass substrate-holding tool 100A shown in FIG. 1 and FIG. 2, the electrostatic chuck has an active surface 112 with an electrode portion embedded therein, which is formed on a top side of a base member 110, more specifically a central portion of the top side.

In the glass substrate-holding tool 100A shown in FIG. 1 and FIG. 2, the active surface 112 is placed so as to be apart from the rear surface of the glass substrate 200 by a gap. The active surface 112 provides an electrostatic attractive force to attract, in a non-contact state, the rear surface of the glass substrate 200, more specifically a quality-guaranteed region 210 present on a central portion of the rear surface. When the glass substrate 200 is a glass substrate of 152.4 mm×152.4 mm, the quality-guaranteed region on the rear surface of the glass substrate 210 is usually a region of 148 mm×148 mm.

As described above, the conventional electrostatic chucks have brought a central portion of a glass substrate, more specifically a central portion of the rear surface of a glass substrate in contact with the active surface to attract and hold the glass substrate. Accordingly, it has been likely that foreign substances adhere to the quality-guaranteed region present on the central portion of the rear surface of the glass substrate or the quality-guaranteed region is scratched.

In contrast, since the active surface 112 of the electrostatic chuck in the glass substrate-holding tool 100A according to the present invention is not brought in contact with the quality-guaranteed region 210 of the rear surface of the glass substrate 200, it is unlikely that foreign substances adhere to the quality-guaranteed region 210 or the quality-guaranteed region is scratched.

In order to hold the glass substrate 200 without the active surface 112 of the electrostatic chuck being brought into contact with the quality-guaranteed region 210 of the rear surface of the glass substrate 200, it is necessary to support an outer portion of the glass substrate 200 (hereinafter, referred to as "the outer peripheral portion of the rear surface") outside the quality-guaranteed region 210 by some sort of tool.

The glass substrate-holding tool 100A according to the present invention holds the glass substrate 200 without bringing the active surface 112 into contact with the quality-guaranteed region 210, by supporting the outer peripheral portion of the rear surface of the glass substrate 200 by a convex portion formed on an outer peripheral portion of the top side of the base member 110. The convex portion serves as the supporting member 114 of the glass substrate-holding tool 100A.

In the glass substrate-holding tool 100A according to the present invention, it is possible to control the distance between the active surface 112 and the quality-guaranteed region 210 of the rear surface of the glass substrate 200 by adjusting the height of the supporting member 114.

When the distance between the active surface 112 and the quality-guaranteed region 210 is too small, it is likely that foreign substances attracted by an electrostatic attractive force from the active surface 112 of the electrostatic chuck are caught in the gap between the active surface 112 and the quality-guaranteed region 210.

When such foreign substances are caught in the gap between the active surface 112 and the quality-guaranteed region 210, it is likely that such foreign substances adhere to the quality-guaranteed region 210 or the quality-guaranteed region is scratched.

Further, when such foreign substances are caught in the gap, it is likely that the glass substrate 200 is deformed. If the glass substrate 200 is deformed, the glass substrate is likely to be further deformed by a film stress caused in a multilayer film or an absorber layer.

For these reasons, the distance between the active surface 112 and the quality-guaranteed region 210 should have a large length to some degree.

In the glass substrate-holding tool 100A according to the present invention, the distance between the active surface 112 and the quality-guaranteed region 210 is longer than 20 μm. When the distance is longer than 20 μm, it becomes more unlikely that foreign substances attracted by an electrostatic attractive force from the active surface 112 of the electrostatic chuck are caught in the gap between the active surface 112 and the quality-guaranteed region 210.

In the glass substrate-holding tool 100A according to the present invention, the distance between the active surface 112 and the quality-guaranteed region 210 is preferably at least 30 μm, more preferably at least 40 μm, further preferably at least 50 μm.

It should be noted that when the distance between the active surface 112 and the quality-guaranteed region 210 is too large, the electrostatic attractive force from the active surface 112 becomes insufficient, which leads to a case where the glass substrate 200 is likely to come off or be displaced during the production of an EUV mask blank.

In the glass substrate-holding tool 100A according to the present invention, the distance between the active surface 112 and the quality-guaranteed region 210 is preferably at most 100 μm. When the distance is at most 100 μm, the glass substrate 200 is unlikely to come off or be displaced during the production of an EUV mask blank since the electrostatic attractive force from the active surface 112 becomes sufficiently large.

In the glass substrate-holding tool 100A according to the present invention, the distance between the active surface 112 and the quality-guaranteed region 210 is preferably at most 90 μm, more preferably at most 80 μm.

As described above, the distance between the active surface 112 and the quality-guaranteed region 210 is as relatively large as longer than 20 μm in the glass substrate-holding tool 100A according to the present invention. In such a case, when the projected area of the active surface 112 of the electrostatic chuck is too small in comparison with the area of the quality-guaranteed region 210 of the rear surface of the glass substrate 200, the electrostatic attractive force is partly applied to the quality-guaranteed region 210, which leads to a case where the glass substrate 200 is likely to be deformed.

Further, if foreign substances are caught in the gap between the active surface 112 and the quality-guaranteed region 210, the glass substrate 200 is likely to be deformed. When the glass substrate 200 is deformed, the glass substrate 200 is likely to be further deformed by a film stress caused in the multilayer film or the absorber layer.

In the glass substrate-holding tool 100A according to the present invention, the ratio of the projected area ($mm^2$) of the active surface 112 to the area ($mm^2$) of the quality-guaranteed region 210 ((the projected area of the active surface 112)/(the area of the quality-guaranteed region 210)) (hereinafter, referred to as "the area ratio of the active surface") is at least 0.5.

When the area ratio of the active surface is at least 0.5, the glass substrate 200 is unlikely to be deformed since the electrostatic attractive force is applied to the entire quality-guaranteed region 210.

It should be noted that the area ratio of the active surface is at most 1.0 since the glass substrate-holding tool 100A according to the present invention attracts the quality-guaranteed region 210 in a non-contact state by the electrostatic attractive force from the active surface 112. When the area ratio of the active surface is larger than 1.0, in other words, when the projected area of the active surface 112 is larger than the area of the quality-guaranteed region 210, the electrostatic attractive force from the active surface 112 is also significantly applied to the outer peripheral portion of the rear surface of the glass substrate 200 supported by the supporting member 114, such that a large amount of charged foreign substances are attracted to the outer peripheral portion of the rear surface, which leads to a case where some of the foreign substances attracted to the outer peripheral portion of the rear surface are transferred onto the quality-guaranteed region 210.

In the glass substrate-holding tool 100A according to the present invention, the area ratio of the active surface is preferably from 0.6 to 0.95, more preferably from 0.7 to 0.9, further preferably from 0.8 to 0.85.

As described above, the active surface 112 has the electrode portion of the electrostatic chuck embedded therein.

The electrostatic chuck is classified into a single pole type which includes only one of a positive pole and a negative pole and provides an electrostatic attractive force by applying a voltage from the only one pole and grounding a generated plasma or the like, and a dual pole type which includes a positive pole and a negative pole and provides an electrostatic attractive force by simultaneously applying a voltage across both poles. The electrostatic chuck employed in the present invention is preferably of a dual pole type from the point of view that an object to be held is a glass substrate constituted by an insulating member. In such a dual pole electrostatic chuck, the electrode portion includes a combination of a positive pole and a negative pole, which forms a certain electrode pattern. The electrode pattern of such a combination is not particularly limited and may be selected from various electrode patterns well-known in the field of dual pole electrostatic chucks. It should be noted that a pair of positive pole and negative pole is preferably formed in an electrode pattern such that each of the poles is formed in a comb tooth shape, and both poles are placed so as to have their comb teeth positioned adjacent to each other, leaving a gap therebetween, in order to effectively produce a gradient force to provide a strong electrostatic attractive force as in the electrostatic chuck disclosed in JP-A-2006-066857.

The electrode portion of the electrostatic chuck is made of a material having excellent conductivity, which specifically has a volume inherent resistance of preferably at most $5\times10^{-6}$ $\Omega$m. Among the materials satisfying this condition, a metal material having excellent conductivity, specifically gold, copper and aluminum are preferred from the point of view that it is possible to reduce the thickness of the electrode portion and it is easy to form the electrode pattern in a desired shape.

Among them, gold and copper are more preferred in terms of excellent conductivity, and copper is particularly preferred in terms of being less expensive.

On the other hand, the base member 110 with the electrode portion embedded therein is required to have insulation. From this point of view, the base member 110 is preferably made of a ceramic material having excellent insulation, such as oxidized aluminum ($Al_2O_3$), yttrium oxide ($Y_2O_3$), oxidized silicon ($SiO_2$), oxidized zirconium ($ZrO_2$), magnesium oxide (MgO) or mullite ($3Al_2O_3.2SiO_2$).

In a case where, as disclosed in Patent Documents 1 to 9, a glass substrate is held by bringing the entire rear surface of the glass substrate into contact with the catching and holding portion of an electrostatic chuck, the electrostatic chuck is optimally employed wherein plural convex portions are formed on the catching and holding portion such that the plural convex portions are brought into contact with the rear surface of the glass substrate.

However, in the glass substrate-holding tool 100A according to the present invention, it is not preferred to configure the active surface 112 so as to have such plural convex portions from the points of view of that the electrostatic attractive force from the active surface 112 of the electrostatic chuck is reduced and that the attractive force may vary from part to part to deform the substrate since the active surface 112 attracts the quality-guaranteed region 210 in a non-contact state.

Accordingly, in the glass substrate-holding tool 100A according to the present invention, the active surface 112 of the electrostatic chuck is preferably flat.

In the glass substrate-holding tool 100A according to the present invention, the active surface 112 of the electrostatic chuck has a flatness of preferably at most 10 μm, more preferably at most 8 μm, further preferably at most 5 μm.

As described above, in the glass substrate-holding tool 100A according to the present invention, the supporting member 114, which is formed on the outer peripheral portion of the top side of the base member 110, supports the outer peripheral portion of the rear surface of the glass substrate 200.

Although the glass substrate-holding tool 100A according to the present invention attracts the quality-guaranteed region 210 in a non-contact state by the electrostatic attractive force from the active surface 112, the electrostatic attractive force from the active surface 112 is also applied, to some degree, to the outer peripheral portion of the rear surface of the glass substrate 200 supported by the supporting member 114, which leads to a case where charged foreign substances are likely to be attracted to the outer peripheral portion of the rear surface.

In order that foreign substances attracted to the outer peripheral portion of the rear surface are prevented from being transferred onto the quality-guaranteed region 210, the support member 114 preferably supports an outer portion of the outer peripheral portion of the rear surface of the glass substrate 200, which is outside a region of the quality-guaranteed region 210+an extension formed by extending the respective sides by 2 mm (a region of the outer peripheral portion outside a region of 150 mm×150 mm in a case where the quality-guaranteed region is a region of 148 mm×148 mm).

When the supporting member 114 supports such an outer portion of the outer peripheral portion of the rear surface outside the region of the quality-guaranteed region 210+an extension formed by extending the respective sides by 2 mm, it is expected to add an advantage of controlling a centrifugal force applied to the glass substrate 200 when the glass substrate 200 is rotated during the protection of an EUV mask blank.

In the glass substrate holding tool 100A shown in FIG. 1, the supporting member 114 supports the entire region including the four sides defining the outer edges of the outer peripheral portion of the rear surface of the glass substrate 200 (in other words, the four sides of the glass substrate 200) in order to hold the glass substrate 200 in such a state that the active surface 112 is not brought into contact with the quality-guaranteed region 210.

Figure 5:
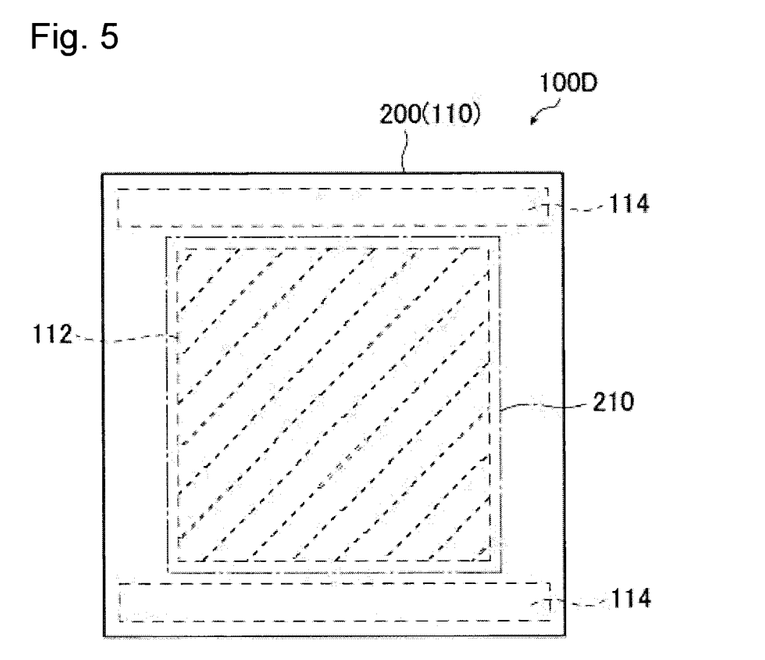
FIG. 5 is a schematic plan view showing the glass substrate-holding tool employed in Example 2 wherein a glass substrate is shown in the substrate-holding tool.
Figure 6:
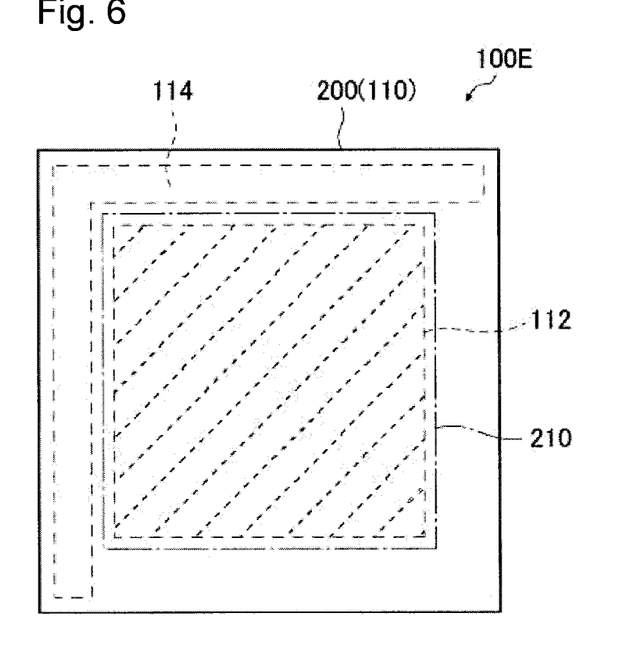
FIG. 6 is a schematic plan view showing the glass substrate-holding tool employed in Example 3 wherein a glass substrate is shown in the substrate-holding tool.
Figure 7:
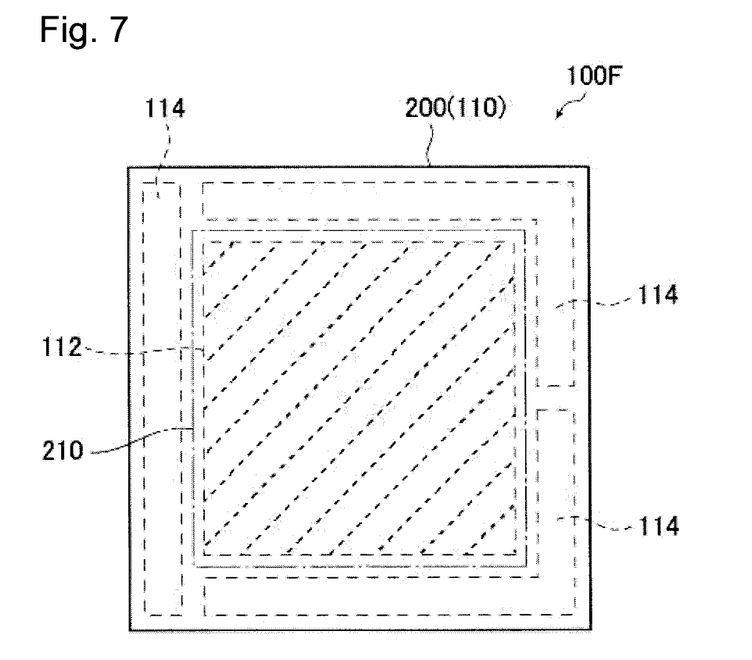
FIG. 7 is a schematic plan view showing the glass substrate-holding tool employed in Example 4 wherein a glass substrate is shown in the substrate-holding tool.

However, the present invention is not limited to this mode. When the supporting member supports a region including at least two sides among the four sides defining the outer peripheral portion of the rear surface of a glass substrate in the glass substrate-holding tool according to the present invention, the glass substrate can be held in such a state that the active surface of an electrostatic chuck is not brought into contact with the quality-guaranteed region of the rear surface of the glass substrate. In this regard, in Example 2 described later, a supporting member 114 supports a region including two opposed sides among the four sides defining the outer edge of the outer peripheral portion of the rear surface of a glass substrate 200 as shown in FIG. 5. Further, in Example 3 described later, a supporting member 114 supports a region including two adjacent sides among the four sides defining the outer edge of the outer peripheral portion of a rear surface of a glass substrate as shown in FIG. 6. Further, in Example 4 described later, three independent supporting members 114 are employed to support the entire region including the four sides defining the outer edge of the outer peripheral portion of the rear surface of a glass substrate 200 as shown in FIG. 7. In each of these examples, the glass substrate 200 was capable of being held in such a state that the active surface 112 is not brought into contact with the quality-guaranteed region 210.

Figure 8:
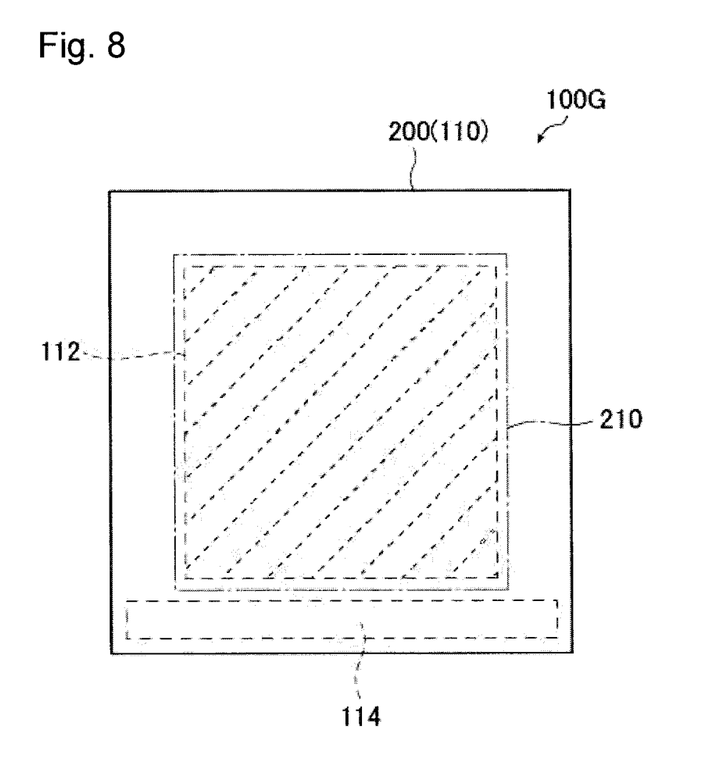
FIG. 8 is a schematic plan view showing the glass substrate-holding tool employed in Comparative Example 2 wherein a glass substrate is shown in the substrate-holding tool.

On the other hand, in Comparative Example 2 described later, a supporting member 114 supported a region including only one side among the four sides defining the outer edge of the outer peripheral portion of the rear surface of a glass substrate 200 as shown in FIG. 8. In this case, the glass substrate 200 inclined, and the active surface 112 was brought into contact with the quality-guaranteed region 210.

In the glass substrate-holding tool 100A according to the present invention, the support member 114 is required to have a sufficient hardness so as not to be broken when supporting the outer peripheral portion of the rear surface of a glass substrate 200.

However, when the supporting member 114 has a higher hardness than a glass substrate to be held, it is likely that the glass substrate is scratched.

For this reason, the supporting member 114 is preferably made of a material having a lower hardness than a glass substrate 200 to be supported thereby.

Only as a guide, the supporting member 114 has a hardness of preferably less than 650, more preferably less than 100, further preferably less than 30 in Vickers hardness (HV).

In the glass substrate-holding tool 100A shown in FIG. 1, the supporting member 114 should not emit a gas component under vacuum atmosphere in a film deposition chamber because of being subjected to a film deposition process performed during the production of an EUV mask blank. Further, the supporting member 114 is required to have a chemical and physical heat resistance to at least about 150° C. since, e.g. a glass substrate 200 has a heat in a film deposition device in some cases.

In order to satisfy the above-mentioned requirements, the supporting member 114 may, for example, be made of an elastomer material, such as a perfluoro elastomer, fluoro rubber or silicone rubber, polyether ether ketone (PEEK), polyimide, a polybenzimidazole (PBI) resin, or a fluororesin.

When among them, silicone rubber is employed, the supporting member 114 can attract the outer peripheral portion of the rear surface of a glass substrate 200 by use of van der Waals attraction, which is generated between the supporting member and the outer peripheral portion of the rear surface supported thereby.

The attraction by use of van der Waals attraction can increase the holding force for a glass substrate 200 without attracting charged foreign substances as in the contact type electrostatic chuck employed as a device for holding a peripheral portion of the rear surface of a reflective mask in the exposure system disclosed in Patent Document 10.

As the method for forming the supporting member 114 on the outer peripheral portion of the top side of the base member 110 in the glass substrate-holding tool 100A shown in FIG. 2, a tape or film made of an elastomer material may be affixed to the outer peripheral portion of the top side of a ceramic base member 110 to form a convex portion made of such an elastomer material for example.

It should be noted that the method for forming the supporting member on the outer peripheral portion of the top side of the base member is not limited to this mode in the glass substrate-holding tool according to the present invention.

Figure 3:
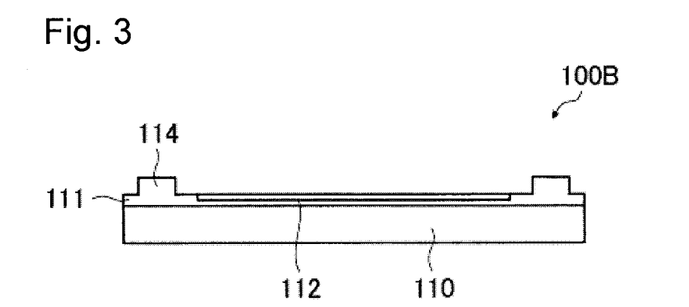
FIG. 3 is a side view of the glass substrate-holding tool according to another embodiment of the present invention wherein portions of a supporting member on a front side and a back side are not shown.

FIG. 3 is a side view of the glass substrate-holding tool according to another embodiment of the present invention. The glass substrate-holding tool 100B shown in FIG. 3 has a layer made of a dielectric material (dielectric layer) 111 formed on a base member 110, and a supporting member 114 formed on an outer peripheral portion of a top side of the dielectric layer 111. In the glass substrate-holding tool 100B shown in FIG. 3, the dielectric layer 111 has a central portion of the top side so as to have an active surface 112 of the electrostatic chuck with an electrode portion embedded therein.

In the glass substrate-holding tool 100B shown in FIG. 3, the dielectric layer 111 may be formed on the base member 110 by affixing a polyimide film to the top side of the base member 110, which is made of a ceramic material. The supporting member 114 may be formed on the outer peripheral portion of the top side of the dielectric layer 111 by forming a convex portion on an outer peripheral portion of the top side of the polyimide film by etching or imprinting.

Figure 4:
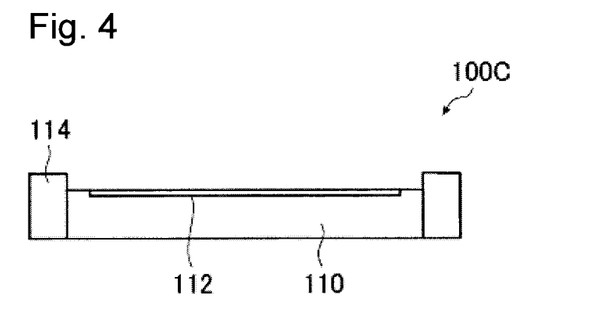
FIG. 4 is a side view of the glass substrate-holding tool according to another embodiment of the present invention wherein portions of a supporting member on a front side and a back side are not shown.

FIG. 4 is a side view of the glass substrate-holding tool according to another embodiment of the present invention. The glass substantially holding tool 100C shown in FIG. 4 has a supporting member 114 attached to a lateral side of a base member 110. The glass substrate-holding tool 100C shown in FIG. 4 may be fabricated by a method wherein the supporting member 114, which is made of a material having an excellent wear resistance, is attached, by screw fixing or embedding into the base member, to the lateral side of the base member 110, which is made of a ceramic material, followed by mechanically polishing the top side of the supporting member 114 such that the supporting member 114 has a desired projection height from the top side thereof. The material having an excellent wear resistance for the supporting member 114 may be, for example, engineering plastics, such as polyether ether ketone (PEEK).

In order that the glass substrate-holding tool according to the present invention is capable of holding a glass substrate during the production of an EUV mask blank without the glass substrate being displaced or coming off, the holding force applied to the glass substrate is preferably at least 1,960 N.

The holding force applied to a glass substrate that is referred to is provided by the attraction of the quality-guaranteed region 210 of a glass substrate 200, which is caused by electrostatic attraction from the active surface 112. However, in a case where the supporting member 114 attracts the outer peripheral portion of the rear surface of a glass substrate 200 by van der Waals attraction, the attraction by such van der Waals attraction is also included.

In the glass substrate-holding tool according to the present invention, the holding force applied to a glass substrate 200 is preferably at least 2,352 N, more preferably at least 2,744 N.

Now, the process for producing an EUV mask blank according to the present invention will be described.

The EUV mask blank has such a basic structure that a reflective layer to reflect EUV light and an absorber layer to absorb EUV light are formed on the film deposition surface of a glass substrate in this order. As the reflective layer for the EUV mask blank, a multilayer reflective film has been widely used which is obtained by alternately stacking a high refractive index film and a low refractive index film in a plurality of times, since it is thereby possible to accomplish a high reflectance in the EUV wavelength region.

The EUV mask blank to be produced by the method according to the present invention may have various functional layers other than as described above. Specific examples of such functional layers may be a protection layer for a reflective layer to be formed on the reflective layer, as the case requires, for the purpose of preventing the surface of the reflective layer from being oxidized, a buffer layer to be formed between the reflective layer and the absorber layer, as the case requires, for the purpose of preventing the reflective layer from receiving a damage during patterning, and a low reflective layer to an inspection light for a mask pattern to be formed on the absorber layer, as the case requires, for the purpose of improving the contrast during the inspection of the mask pattern.

Further, the glass substrate may have an electroconductive film disposed on the rear surface.

In the method for producing an EUV mask blank according to the present invention, the reflective layer and the absorber layer may be formed on the film deposition surface of a glass substrate, by a dry film deposition method, e.g. a sputtering method, such as a magnetron sputtering method or an ion beam sputtering method, a CVD method or a vacuum vapor deposition method.

In the case of producing an EUV mask blank having the above-mentioned various functional films to be formed as the case requires, the above-mentioned various functional films may be formed on the film deposition surface of the glass substrate by a dry film deposition method.

Among such film deposition methods, a suitable one may be selected for use depending on a film to be formed. However, a sputtering method, such as a magnetron sputtering method or an ion beam sputtering method, is preferred from such a viewpoint that a uniform film thickness can easily be obtained, and the takt time is short.

In the case of producing an EUV mask blank having the above-described basic structure by using the method for producing an EUV mask blank according to the present invention, a glass substrate is caught and held by the glass substrate-holding tool according to the present invention at the time of forming at least one of a reflective layer and an absorber layer by a dry film deposition method.

Therefore, only when either one of the reflective layer and the absorber layer is formed, the glass substrate may be held by the glass substrate-holding tool according to the present invention, and when the remaining one is formed, another holding tool (such as an ordinary electrostatic chuck) may be used to hold the glass substrate.

However, when a glass substrate is held by the glass substrate-holding tool according to the present invention, it is possible not only to prevent the glass substrate from displacing, coming off or being deformed but also to control the occurrence of scratches or the deposition of foreign substances caused by the holding action during the production of an EUV mask blank, as described above. Accordingly, it is preferred to hold the glass substrate by using the glass substrate-holding tool according to the present invention, at the time of forming all of such layers.

In the case of producing an EUV mask blank having the above-described various functional films to be formed as the case requires, it is preferred to hold a glass substrate by the glass substrate-holding tool according to the present invention also at the time of forming such various functional films by a dry film deposition method.

The EUV mask blank having the above-described basic structure in a state prior to forming an absorber layer, i.e. one having a reflective layer formed on the film deposition surface of the glass substrate, is a reflective layer-provided substrate for EUVL to be produced by the method according to the present invention, which constitutes a precursor for an EUV mask blank.

In the method for producing a reflective layer-provided substrate for EUVL according to the present invention, a glass substrate is held by means of the glass substrate-holding tool according to the present invention at the time of forming a reflective layer on the film deposition surface of the glass substrate by a dry film deposition method.

Now, structural examples of the EUV mask blank to be produced by the method according to the present invention will be described.

The glass substrate to be used for the production of the EUV mask blank satisfies the properties required as the substrate for an EUV mask blank.

The glass substrate has a low thermal expansion coefficient (preferably $0\pm1.0\times10^{-7}/°$ C., more preferably $0\pm0.3\times10^{-7}/°$ C., further preferably $0\pm0.2\times10^{-7}/°$ C., still further preferably $0\pm0.1\times10^{-7}/°$ C., particularly preferably $0\pm0.05\times10^{-7}/°$ C.) and is preferably excellent in smoothness, flatness and durability against a cleaning liquid to be used for cleaning a mask blank or a photomask after forming a pattern. Specifically, as the glass substrate, it is possible to use a glass having a low thermal expansion coefficient, such as a $SiO_2$—$TiO_2$ glass.

The glass substrate preferably has a smooth surface of at most 0.15 nm rms and a flatness of at most 100 nm because of being capable of obtaining a high reflectance and transfer precision in a photomask after forming a pattern.

The size, thickness, etc. of the glass substrate are suitably determined based on the designed values, etc. for the mask. In each of the Examples described later, a $SiO_2$—$TiO_2$ glass having a size of 6 inch (152.4 mm) square and a thickness of 0.25 inch (6.3 mm) was used.

It is preferred that no defects be present on the film deposition surface of the glass substrate, in particular the quality-guaranteed region. However, even when present, in order that no phase defect will be formed by concave defects and/or convex defects, the depths of the concave defects and the heights of the convex defects are preferably at most 2 nm, and the half value widths of such concave defects and convex defects are preferably at most 60 nm.

It is preferred that no convex defects, which have a height of more than 2 nm or have a half value width of more than 60 nm, be present on the outer peripheral portion on the film deposition surface since such convex defects are possibly transferred to the quality-guaranteed region.

It is preferred that no convex defects, which have a height of more than 1 μm, be present on the rear surface of the glass substrate, in particular the quality-guaranteed region on the rear surface. It is preferred that no convex defects, which have a height of more than 1 μm, be present also on the outer peripheral portion of the rear surface of the glass substrate since such convex defects are possibly transferred to the quality-guaranteed region on the rear surface.

The property especially required for the reflective layer of an EUV mask blank is a high EUV light reflectance. Specifically, when a reflective layer surface is irradiated with light rays in a wavelength region of EUV light at an incident angle of 6°, the maximum value of the light ray reflectance in the vicinity of a wavelength of 13.5 nm is preferably at least 60%, more preferably at least 65%.

As the reflective layer for an EUV mask blank, a multilayer reflective film has been widely used wherein a low refractive index film and a high refractive index film are alternately stacked in a plurality of times, since a high reflectance can thereby be accomplished in an EUV wavelength region. A specific example of such a multilayer reflective film may be a Mo/Si multilayer reflective film wherein a Mo film as a low refractive index film and a Si film as a high refractive index film are alternately stacked in a plurality of times.

In the case of such a Mo/Si multilayer reflective film, in order to obtain a reflective layer with the maximum value of the EUV light ray reflectance of at least 60%, a Mo layer having a thickness of 2.3±0.1 nm and a Si layer having a thickness of 4.5±0.1 nm may be stacked so that the number of repeating times will be from 30 to 60.

Here, each layer to constitute the Mo/Si multilayer reflective film may be formed by a dry film deposition method, specifically a sputtering method, such as a magnetron sputtering method or an ion beam sputtering method, such that the a desired thickness may be obtained. For example, in the case of forming a Mo/Si multilayer reflective film by means of an ion beam sputtering method, it is preferred that a Mo layer be formed by using a Mo target as the target, using an Ar gas (gas pressure: $1.3 \times 10^{-2}$ Pa to $2.7 \times 10^{-2}$ Pa) as the sputtering gas at an ion acceleration voltage of from 300 to 1,500 V and at a film deposition rate of from 0.03 to 0.30 nm/sec to bring the thickness to be 2.3 nm, and then, a Si layer is formed by using a Si target as the target, using an Ar gas (gas pressure: $1.3 \times 10^{-2}$ Pa to $2.7 \times 10^{-2}$ Pa) as the sputtering gas at an ion acceleration voltage of from 300 to 1,500 V and at a film deposition rate of from 0.03 to 0.30 nm/sec to bring the thickness to be 4.5 nm. When this operation is taken as one cycle, the Mo layer and the Si layer are stacked by from 40 to 50 cycles to obtain a Mo/Si multilayer reflective film.

The property especially required for the absorber layer is that the EUV light ray reflectance is extremely low. Specifically, when the absorber layer surface is irradiated with light rays in a wavelength region of EUV light, the maximum light ray reflectance in the vicinity of a wavelength of 13.5 nm is preferably at most 0.5%, more preferably at most 0.1%.

In order to accomplish the above-mentioned property, the absorber layer is preferably made of a material having a high absorption coefficient of EUV light. As a specific example of the material having a high absorption coefficient of EUV light, a material composed mainly of tantalum (Ta) may be mentioned.

A specific example of the absorber layer constituted by the material composed mainly of tantalum (Ta) may be an absorber layer (TaBSiN film) containing Ta, B, Si and nitrogen (N) in the following ratio.

Content of B: at least 1 at % and less than 5 at %, preferably from 1 to 4.5 at %, more preferably from 1.5 to 4 at %

Content of Si: from 1 to 25 at %, preferably from 1 to 20 at %, more preferably from 2 to 12 at %

The compositional ratio of Ta to N (Ta:N): from 8:1 to 1:1

Content of Ta: preferably from 50 to 90 at %, more preferably from 60 to 80 at %

Content of N: preferably from 5 to 30 at %, more preferably from 10 to 25 at %

The absorber layer (TaBSiN film) of the above-mentioned composition is such that its structural state is amorphous, and it is excellent in the surface smoothness.

With the absorber layer (TaBSiN film) having the above-mentioned composition, the surface roughness of the absorber layer surface can be made to be at most 0.5 nm rms. If the surface roughness of the absorber layer surface is large, the edge roughness of a pattern formed in the absorber layer becomes large, whereby the dimensional precision of the pattern becomes poor. As the pattern becomes finer, the influence of the edge roughness becomes more distinct. Therefore, the surface of the absorber layer is required to be smooth.

When the surface roughness of the absorber layer surface is at most 0.5 nm rms, the absorber layer surface is sufficiently smooth, whereby there will be no deterioration of the dimensional precision of a pattern due to influence of edge roughness.

The thickness of the absorber layer is preferably from 50 to 100 nm.

The absorber layer (TaBSiN film) having the above-mentioned composition can be formed by means of a dry film deposition method, specifically a sputtering method, such as a magnetron sputtering method or an ion beam sputtering method. In a case where a magnetron sputtering method is employed, the absorber layer (TaBSiN film) can be formed by the following methods (1) to (3).

(1) The absorber layer (TaBSiN film) is formed by using a Ta target, a B target and a Si target and letting these individual targets discharge simultaneously in a nitrogen ($N_2$) atmosphere diluted with Ar.

(2) The absorber layer (TaBSiN film) is formed by using a TaB compound target and a Si target and letting these targets discharge simultaneously in an $N_2$ atmosphere diluted with Ar.

(3) The absorber layer (TaBSiN film) is formed by using a TaBSi compound target and letting this target having the three elements integrated discharge in an $N_2$ atmosphere diluted with Ar.

Here, among the above-mentioned methods, in a method wherein at least two targets are discharged simultaneously (method (1) or (2)), the composition of the absorber layer to be formed can be controlled by adjusting the electric power to be applied to each target.

Among the above, methods (2) and (3) are preferred in that it is thereby possible to avoid instability in the discharge or fluctuation in the composition or thickness of the film, and method (3) is particularly preferred. With the TaBSi compound target, its composition is preferably composed of from 50 to 94 at % of Ta, from 5 to 30 at % of Si and from 1 to 20 at % of B, whereby it is possible to avoid instability in the discharge or fluctuation in the composition or thickness of the film, such being particularly preferred.

The formation of the absorber layer (TaBSiN film) by the above-mentioned exemplified methods may be specifically carried out under the following film deposition conditions.

Method (2) Using TaB Compound Target and Si Target

Sputtering gas: mixed gas of Ar and $N_2$ ($N_2$ gas concentration: from 3 to 80 vol %, preferably from 5 to 30 vol %, more preferably from 8 to 15 vol %; gas pressure: from $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa)

Electric power applied (to each target): from 30 to 1,000 W, preferably from 50 to 750 W, more preferably from 80 to 500 W Film deposition rate: from 2.0 to 60 nm/sec, preferably from 3.5 to 45 nm/sec, more preferably from 5 to 30 nm/sec Method (3) Using TaBSi Compound Target Sputtering gas: mixed gas of Ar and $N_2$ ($N_2$ gas concentration: from 3 to 80 vol %, preferably from 5 to 30 vol %, more preferably from 8 to 15 vol %; gas pressure: from $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa)

Electric power applied: from 30 to 1,000 W, preferably from 50 to 750 W, more preferably from 80 to 500 W Film deposition rate: from 2.0 to 60 nm/sec, preferably from 3.5 to 45 nm/sec, more preferably from 5 to 30 nm/sec

EXAMPLES

Now, the present invention will be described in more detail with reference to Examples, but, it should be understood that the present invention is by no means restricted to such Examples.

Example 1

In Example 1, a glass substrate 200 of 152.4 mm×152.4 mm (thickness: 6.3 mm) was held by the glass substrate-holding tool 100A shown in FIGS. 1 and 2. In the case of using this glass substrate as a substrate for an EUV mask blank, the glass substrate of 152.4 mm×152.4 mm has a quality-guaranteed region 210 present in a region of 148 mm×148 mm about the center on a rear surface. The glass substrate 200 is made of zero expansion glass ($SiO_2$—$TiO_2$ glass) composed mainly of $SiO_2$ and has a thermal expansion coefficient of 0/° C. at 22° C. and a hardness of 650 in Vickers hardness (HV).

In the glass substrate-holding tool 100A, an active surface 112 of the electrostatic chuck with an electrode portion embedded therein is present in a central portion of a top side of a ceramic base member 110 of 152.4 mm×152.4 mm. The area ratio of the active surface 112 is 0.8.

A tape made of silicone rubber (having a hardness of 30 in Vickers hardness (HV)) was affixed on a region having a width of 1 mm outside the active surface 112 on the top side of the base member 110 of 152.4 mm×152.4 mm to form a convex portion (supporting member 114) having a height of 50 μm.

Each of the holding forces applied to the glass substrate (the electrostatic attraction by the active surface 112 and the van der Waals attraction from the supporting member 114) was as follows:
Electrostatic attraction by active surface 112: 2,156 N
van der Waals attraction: 490 N In order to simulate a state in a film deposition process performed during the production of an EUV mask blank, the glass substrate-holding tool 100A was rotated at 30 rpm for 30 minutes, holding the glass substrate.

After performing the above-mentioned procedure, the number of defects on the rear surface of the glass substrate 200 was measured by the following procedure:
Method for Measuring the Number of Defects With respect to the rear surface of the glass substrate 200 taken out of the glass substrate-holding tool 100A, the number of the defects having a size of at least 200 nm was measured by a commercially available defect-inspecting apparatus (M1350 manufactured by Lasertec Corporation). The inspected region covered an entire region of 152.4 mm×152.4 mm on the rear surface. Each of the region of 148 mm×148 mm about the substrate center (quality-guaranteed region) and a region except for the region of 148 mm×148 mm (outer peripheral portion on the rear surface) on the rear surface was evaluated in terms of the number of defects. As a result, it was revealed that the number of defects having a size of at least 200 nm on the quality-guaranteed region and the outer peripheral portion of the rear surface was zero.

Example 2

In Example 2, the glass substrate-holding tool 100D shown in FIG. 5 was employed. In the glass substrate-holding tool 100D shown in FIG. 5, the supporting member 114 supported a region including two opposed sides among the four sides defining the outer edge of the rear surface of a glass substrate 200. In this example, each of the holding forces applied to the glass substrate (the electrostatic attraction by the active surface 112 and the van der Waals attraction from the supporting member 114) was as follows:
Electrostatic attraction by active surface 112: 2,156 N
van der Waals attraction: 245 N
The other data is the same as that in Example 1.
The number of defects having a size of at least 200 nm on the quality-guaranteed region and the outer peripheral portion of the rear surface was zero.

Example 3

In Example 3, the glass substrate-holding tool 100E shown in FIG. 6 was employed. In the glass substrate-holding tool 100E shown in FIG. 6, the supporting member 114 supported a region including two adjacent sides among the four sides defining the outer edge of the rear surface of a glass substrate 200. In this example, each of the holding forces applied to the glass substrate (the electrostatic attraction by the active surface 112 and the van der Waals attraction from the supporting member 114) was as follows:
Electrostatic attraction by active surface 112: 2,156 N
van der Waals attraction: 245 N
The other data is the same as that in Example 1.
The number of defects having a size of at least 200 nm on the quality-guaranteed region and the outer peripheral portion of the rear surface was zero.

Example 4

In Example 4, the glass substrate-holding tool 100F shown in FIG. 7 was employed. The glass substrate-holding tool 100F shown in FIG. 7 is the same as that in Example 1 except that the supporting member 114 is constituted by three independent supporting members.

In this example, each of the holding forces applied to the glass substrate (the electrostatic attraction by the active surface 112 and the van der Waals attraction from the supporting member 114) was as follows:
Electrostatic attraction by active surface 112: 2,156 N
van der Waals attraction: 490 N
The number of defects having a size of at least 200 nm on the quality-guaranteed region and the outer peripheral portion of the rear surface was zero.

Example 5

Example 5 is the same as Example 1 except that the area ratio of the active surface of the glass substrate-holding tool is 0.5.

In this example, each of the holding forces applied to the glass substrate (the electrostatic attraction by the active surface 112 and the van der Waals attraction from the supporting member 114) was as follows:
Electrostatic attraction by active surface: 2,156 N
van der Waals attraction: 490 N
The number of defects having a size of at least 200 nm on the quality-guaranteed region and the outer peripheral portion of the rear surface was zero.

Example 6

Example 6 is the same as Example 1 except that the area ratio of the active surface of the glass substrate-holding tool is 1.0.

In this example, each of the holding forces applied to the glass substrate (the electrostatic attraction by the active surface 112 and the van der Waals attraction from the supporting member 114) was as follows:

Electrostatic attraction by active surface: 2,156 N
van der Waals attraction: 490 N The number of defects having a size of at least 200 nm on the quality-guaranteed region and the outer peripheral portion of the rear surface was zero.

Comparative Example 1

Comparative Example 1 is the same as Example 1 except that a tape, which was made of silicone rubber (having a hardness of 30 in Vickers hardness (HV)) and had a width of 1 mm, was affixed to a region between a 142 mm square area and a 144 mm square area to form a convex portion (supporting member) having a height of 50 µm.

In this example, each of the holding forces applied to the glass substrate (the electrostatic attraction by the active surface and the van der Waals attraction from the supporting member) was as follows:

Electrostatic attraction by active surface: 2,156 N
van der Waals attraction: 490 N The number of defects having a size of at least 200 nm on the quality-guaranteed region was about 400.

Comparative Example 2

In Comparative Example 2, the glass substrate-holding tool 100G shown in FIG. 8 was employed. The glass substrate-holding tool 100G shown in FIG. 8 is the same as that in Example 1 except that the supporting member 114 supports a region including only one side among the four sides defining the outer edge of the rear surface of a glass substrate 200.

In this example, each of the holding forces applied to the glass substrate (the electrostatic attraction by the active surface 112 and the van der Waals attraction from the supporting member 114) was as follows:

Electrostatic attraction by active surface 112: 2,156 N
van der Waals attraction: 122.5 N When the supporting member supported the glass substrate 200, the glass substrate 200 inclined, whereby the active surface 112 of the electrostatic chuck was brought into contact with the quality-guaranteed region 210 of the glass substrate 200. The number of defects having a size of at least 200 nm on the quality-guaranteed region was about 100.

Comparative Example 3

Comparative Example 3 is the same as Example 1 except that the area ratio of the active surface of the glass substrate-holding tool is 0.4.

In this example, each of the holding forces applied to the glass substrate (the electrostatic attraction by the active surface and the van der Waals attraction from the supporting member) was as follows:

Electrostatic attraction by active surface: 2,156 N
van der Waals attraction: 490 N Since the quality-guaranteed region was partly affected by the electrostatic attraction, the glass substrate was deformed, and the flatness of the glass substrate taken out of the glass substrate-holding tool was degraded. The number of defects having a size of at least 200 nm on the quality-guaranteed region and the outer peripheral portion of the rear surface was zero.

Comparative Example 4

Comparative Example 4 is the same as Example 1 except that the active surface of the electrostatic chuck with an electrode portion embedded therein was present on an area having a width of 50 mm on an outer peripheral portion of the top side of a ceramic base member of 152.4 mm×152.4 mm and that a tape, which was made of silicone rubber (having a hardness of 30 in Vickers hardness (HV)) and had a width of 1 mm, was affixed to the active surface to form a convex portion (supporting member) having a height of 50 µm. In this example, each of the holding forces applied to the glass substrate (the electrostatic attraction by the active surface and the van der Waals attraction form the supporting member) was as follows:

Electrostatic attraction by active surface: 2,156 N
van der Waals attraction: 490 N The number of defects having a size of at least 200 nm on the outer peripheral portion of the rear surface was about 500. The number of defects having a size of at least 200 nm on the quality-guaranteed region was about 30. It is presumed that the defects on the quality-guaranteed region were generated by transfer of foreign substances from the outer peripheral portion of the rear surface.

Comparative Example 5

Comparative Example 5 is the same as Example 1 except that the supporting member of the glass substrate-holding tool has a height of 10 µm.

In this example, each of the holding forces applied to the glass substrate (the electrostatic attraction by the active surface and the van der Waals attraction from the supporting member) was as follows:

Electrostatic attraction by active surface: 2,156 N
van der Waals attraction: 490 N The number of defects having a size of at least 200 nm on the quality-guaranteed region was about 150. This is because it is presumed that since the distance between the glass substrate and the active surface of the electrostatic chuck was as small as 10 µm, foreign substances present on the active surface were brought into contact with the substrate to induce further generation of foreign substances or cause the transfer of foreign substances by electrostatic movement.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 2011-132462 filed on Jun. 14, 2011 including specification, claims, drawings and summary are incorporated herein by reference in its entirety.

What is claimed is:

1. A glass substrate-holding tool, comprising:
an electrostatic chuck having an active surface configured to generate an electrostatic attractive force such that the electrostatic attractive force from the electrostatic chuck attracts a rear surface of a reflective mask blank comprising a glass substrate for EUV; and
a supporting device positioned outside the active surface of the electrostatic chuck and configured to support the reflective mask blank such that the supporting device makes contact with an outer peripheral region of the rear surface of the reflective mask blank surrounding a quality-guaranteed region of the rear surface of the reflective mask blank and that the active surface of the electrostatic chuck is kept apart from the quality-guaranteed region of the rear surface of the reflective mask blank by a distance of longer than 20 μm in a non-contact state, wherein the active surface of the electrostatic chuck is configured to form a projected area of the electrostatic attractive force which has a ratio of the projected area to an area of the quality-guaranteed region of the reflective mask blank in a range of at least 0.5 and at most 1.0.

2. The glass substrate-holding tool according to claim 1, wherein the supporting device is configured to keep the active surface of the electrostatic chuck apart from the rear surface of the reflective mask blank by a distance in a range of at least 30 μm to at most 100 μm.

3. The glass substrate-holding tool according to claim 1, wherein the supporting device is made of a material having a hardness which is lower than a hardness of the reflective mask blank.

4. The glass substrate-holding tool according to claim 1, wherein the supporting device is configured to attract a supported portion of the rear surface of the reflective mask blank by van der Waals attraction.

5. The glass substrate-holding tool according to claim 1, wherein the electrostatic chuck and the supporting device are configured to generate a total holding force of at least 1,960 N with respect to the reflective mask blank.

6. A method for producing a reflective layer-provided substrate for EUV lithography, comprising:
holding the glass substrate on the glass substrate-holding tool according to claim 1; and
forming a reflective layer which reflects EUV light over a surface of the glass substrate by a dry deposition method such that the reflective mask blank for EUV lithography is obtained.

7. A method for producing a reflective mask blank for EUV lithography, comprising:
holding the glass substrate on the glass substrate-holding tool according to claim 1;
forming a reflective layer which reflects EUV light over a surface of the glass substrate by a dry deposition method; and
forming an absorber layer over the reflective layer by a dry deposition method such that the reflective mask blank for EUV lithography is obtained.

8. The glass substrate-holding tool according to claim 1, wherein the supporting device is configured to support the reflective mask blank at a position 2 mm away from the quality-guaranteed region of the rear surface of the reflective mask blank.

9. The glass substrate-holding tool according to claim 1, wherein the quality-guaranteed region of the rear surface of the reflective mask blank has a rectangular shape having a dimension of 148 mm×148 mm, and the supporting device is configured to support the reflective mask blank at a position 2 mm away from the quality-guaranteed region of the rear surface of the reflective mask blank.

10. The glass substrate-holding tool according to claim 1, wherein the supporting device is a support member configured to support the reflective mask blank at four sides forming the outer peripheral region of the rear surface of the reflective mask blank.

11. The glass substrate-holding tool according to claim 1, wherein the supporting device is a plurality of support members configured to support the reflective mask blank at two opposing sides forming the outer peripheral region of the rear surface of the reflective mask blank.

12. The glass substrate-holding tool according to claim 1, wherein the supporting device is a plurality of support members configured to support the reflective mask blank at four sides forming the outer peripheral region of the rear surface of the reflective mask blank.

13. The glass substrate-holding tool according to claim 1, wherein the electrostatic chuck comprises a ceramic base member, and the active surface comprises an electrode portion embedded in the ceramic base member.

14. The glass substrate-holding tool according to claim 1, wherein the electrostatic chuck comprises a base member, the active surface comprises an electrode portion embedded in the base member, and the supporting device comprises the base member.

15. The glass substrate-holding tool according to claim 1, wherein the electrostatic chuck comprises a ceramic base member, the active surface comprises an electrode portion embedded in the ceramic base member, and the supporting device comprises the ceramic base member.

16. The glass substrate-holding tool according to claim 1, wherein the active surface comprises an electrode portion having an electrode pattern comprising positive pole portions and negative pole portions.

17. The glass substrate-holding tool according to claim 1, wherein the electrostatic chuck comprises a base member, the active surface comprises an electrode portion embedded in the base member, the supporting device comprises the base member, and the active surface comprises an electrode portion having an electrode pattern comprising positive pole portions and negative pole portions.

18. The glass substrate-holding tool according to claim 1, wherein the electrostatic chuck comprises a base member, the active surface comprises an electrode portion embedded in the base member, and the supporting device comprises a convex portion of the base member.

19. The glass substrate-holding tool according to claim 1, wherein the electrostatic chuck comprises a base member, the active surface comprises an electrode portion embedded in the base member, and the supporting device comprises a plurality of convex portions of the base member.

20. The glass substrate-holding tool according to claim 1, wherein the active surface of the electrostatic chuck has a flat surface having a flatness of at most 10 μm.

* * * * *